(12) United States Patent
Tseng et al.

(10) Patent No.: US 6,880,346 B1
(45) Date of Patent: Apr. 19, 2005

(54) TWO STAGE RADIATION THERMOELECTRIC COOLING APPARATUS

(75) Inventors: Hsiang-Chieh Tseng, Banciao (TW); Yi-Song Liu, Taipei (TW); Chia-Min Chou, Sanchong (TW); Chia-Feng Yeh, Banciao (TW)

(73) Assignee: Giga-Byte Technology Co., Ltd., Taipei (TW)

( * ) Notice: Subject to any disclaimer, the term of this patent is extended or adjusted under 35 U.S.C. 154(b) by 0 days.

(21) Appl. No.: 10/885,762

(22) Filed: Jul. 8, 2004

(51) Int. Cl.[7] .............................................. F25B 21/02
(52) U.S. Cl. ............................ 62/3.7; 62/3.2; 62/259.2
(58) Field of Search ............................ 62/3.2, 3.3, 3.7, 62/259.2; 165/104.21; 136/203, 204

(56) References Cited

U.S. PATENT DOCUMENTS 5,724,818 A * 3/1998 Iwata et al. .................. 62/3.7
5,813,233 A * 9/1998 Okuda et al. ................ 62/3.7
6,226,994 B1 * 5/2001 Yamada et al. .............. 62/3.7
6,233,944 B1 * 5/2001 Yamada et al. .............. 62/3.7

* cited by examiner

*Primary Examiner*—Melvin Jones
(74) *Attorney, Agent, or Firm*—Rosenberg, Klein & Lee

(57) ABSTRACT

The present invention provides a thermoelectric cooling apparatus for cooling an electronic device such as a CPU, or a computer chip. The apparatus cools the electronic device by two stages. In the first stage, a heat absorbing block collects the heat produced by the electronic device and the apparatus pre-cools the electronic device by dissipating a portion of the collected heat in a distant location through a front heat conductive device and a front radiator. Thereby the heat of the electronic device is reduced to a degree that a TEC can efficiently handle. In the second stage, a TEC of the apparatus dissipate the residual of the heat produced by the electronic device through at least a back heat pipe and a back radiator.

20 Claims, 10 Drawing Sheets

TWO STAGE RADIATION THERMOELECTRIC COOLING APPARATUS

TECHNICAL FIELD

This invention relates generally to a thermoelectric cooling apparatus, in particular, a two stage radiation thermoelectric cooling apparatus for cooling an electronic device.

BACKGROUND OF THE INVENTION

Central Processing Units (CPUs) of computers generate large quantities of heat during operation, especially as the speed of operation increases. However, this heat, if confined in the computer housing, can affect the operation and reliability of many heat sensitive elements forming parts of the computer, including the CPU itself, motherboard components, memory, CD ROM, CDRW, DVD, hard drive, Disk on Chip, Magnetic media, floppy drives, electronic cards, etc especially in personal computers, industrial computers, servers, workstations, mainframes, other computers and telecommunication devices.

A conventional cooler for cooling an electronic device such as CPU mainly contains a heat sink and a fan. The heat sink is made of copper or aluminum. The heat sink collects heat from the electronic device and the fan blow away the heat collected therefrom. The trend at present is to increase the power of the CPUs, which causes an increase in the temperature inside the computer housing. The conventional cooler sometimes cannot sufficiently remove the heat produced. Accordingly, it is becoming more necessary to find an efficient cooling apparatus.

At present, there is a known device known as thermoelectric cooler (TEC). A thermoelectric cooler includes a cold side and a hot side which, under a voltage difference, pump heat using the Peltier effect. The thermoelectric cooler utilizes electrical current to absorb heat from the cold side of the cooler and dissipate that heat on the hot side (opposite side).

A conventional TEC apparatus comprises a TEC and a heat sink. The cold side of the conventional TEC apparatus contacts a CPU. The TEC transmits the heat collected from the CPU to the heat sink and the heat sink dissipates the heat.

Another conventional TEC apparatus comprises a TEC and a heat sink. The heat sink contacts a CPU and collects heat therefrom. A cold side of the TEC contacts the heat sink and transmitted the heat to a hot side of the TEC and then dissipates the heat to the air.

These devices are very reliable and cost effective in low wattage applications. However, in high wattage applications, a conventional TEC apparatus is less efficient than a conventional non-TEC cooler as illustrated in FIG. 4 (test results.) In FIG. 4, the horizontal axis represents CPU wattage, the vertical axis represents heat resistance, curve C1 represents a non-TEC cooler and curve C2 represents a conventional TEC apparatus. The test results are based on same testing circumstances such as using the same CPU, and the same fan under the same rotating speed (4200 rpm). The lower heat resistance, the more efficient the cooler.

In addition, the conventional TEC apparatuses don't provide detecting temperature sensors directly contacting the CPUs. Therefore, the control circuits thereof cannot receive precise temperature indications, so cannot precisely control the amount of electricity provided to the TECs in accordance with the indication. Accordingly, it would be very desirable to have an efficient thermoelectric cooling apparatus for an electronic device such as a CPU, or a computer chip which does not suffer from the drawbacks of the conventional coolers or the conventional TEC apparatuses.

SUMMARY OF INVENTION

It is therefore an objective of the present invention to provide a thermoelectric cooling apparatus, which works efficiently under both low and high wattage applications.

Another object of the invention is to provide a thermoelectric cooling apparatus that can precisely provide required electricity to the TEC thereof.

The present invention, briefly summarized, in one embodiment discloses a thermoelectric cooling apparatus for cooling an electronic device. The thermoelectric cooling apparatus mainly contains a front heat absorbing block, a front heat conductive device, a front radiator, a thermoelectric cooler, and a back radiating module. The front heat absorbing block has a first surface and a second surface. The first surface is the opposite side of the second surface and the first surface contacts the electronic device. The front heat conductive device, such as at least a heat pipe or a water-cooling loop, has a first portion and a second portion. The first portion is connected with the front heat absorbing block. The second portion extends from an end of the first portion to a remote end away from the front heat absorbing block. The front radiator is connected with the second portion of the front heat conductive device. The thermoelectric cooler has a cold side and a hot side and the cold side is the opposite side of the hot side. The cold side contacts the second surface of the front heat absorbing block for transmitting heat collected from the front heat absorbing block from the cold side to the hot side. The back radiating module contacts the hot side of the thermoelectric cooler for radiating heat collected therefrom.

BRIEF DESCRIPTION OF DRAWINGS

The invention will be more clearly understood after referring to the following detailed description read in conjunction with the drawings wherein.

DETAILED DESCRIPTION OF PREFERRED EMBODIMENTS

The present invention provides a thermoelectric cooling apparatus for cooling an electronic device such as a CPU, or a computer chip. The thermoelectric cooling apparatus cools the electronic device by two stages. In the first stage, the thermoelectric cooling apparatus pre-cools the electronic device by dissipating a portion of the heat produced by the electronic device in a distant location. Thereby the heat of the electronic device is reduced to a degree that a TEC can efficiently process. In the second stage, a TEC of the apparatus dissipate the residual of the heat produced by the electronic device.

Figure 1:
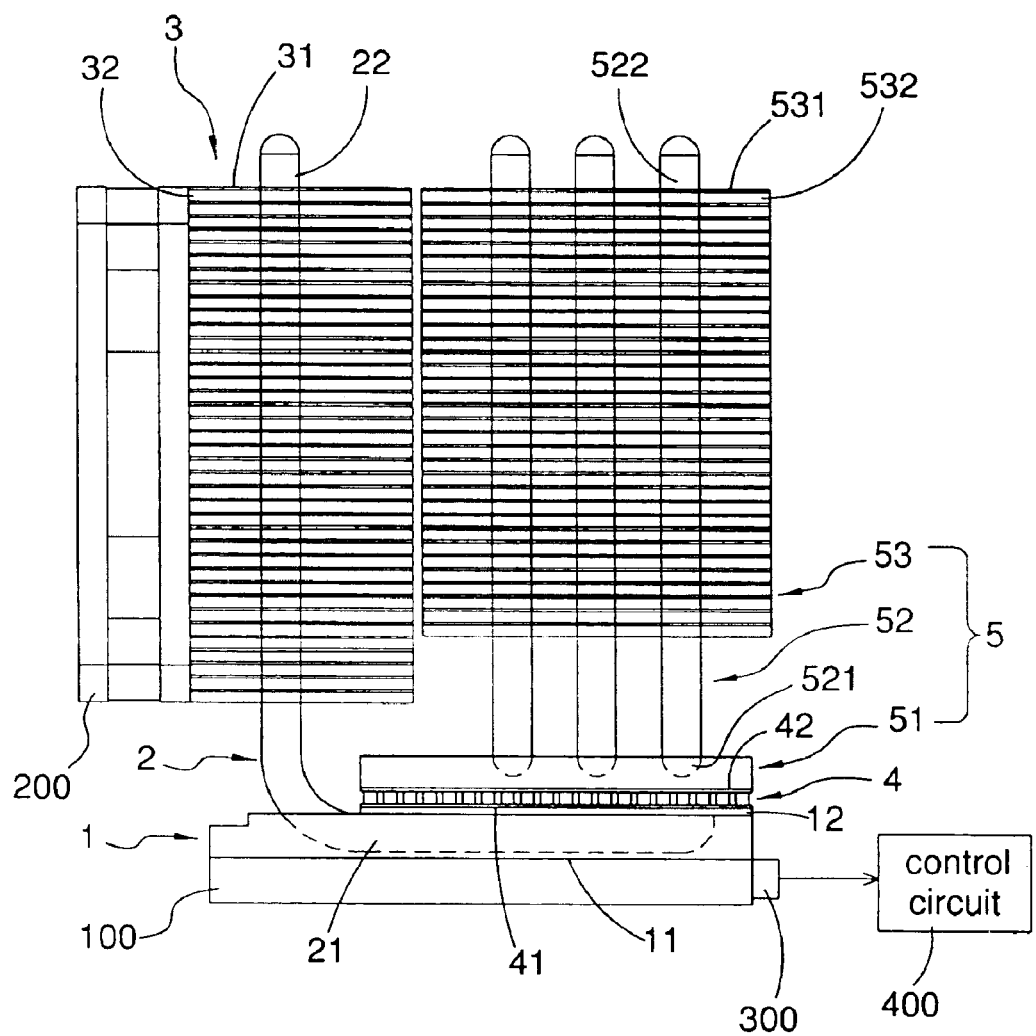
FIG. 1 is a side view of the first embodiment of present invention.
Figure 2:
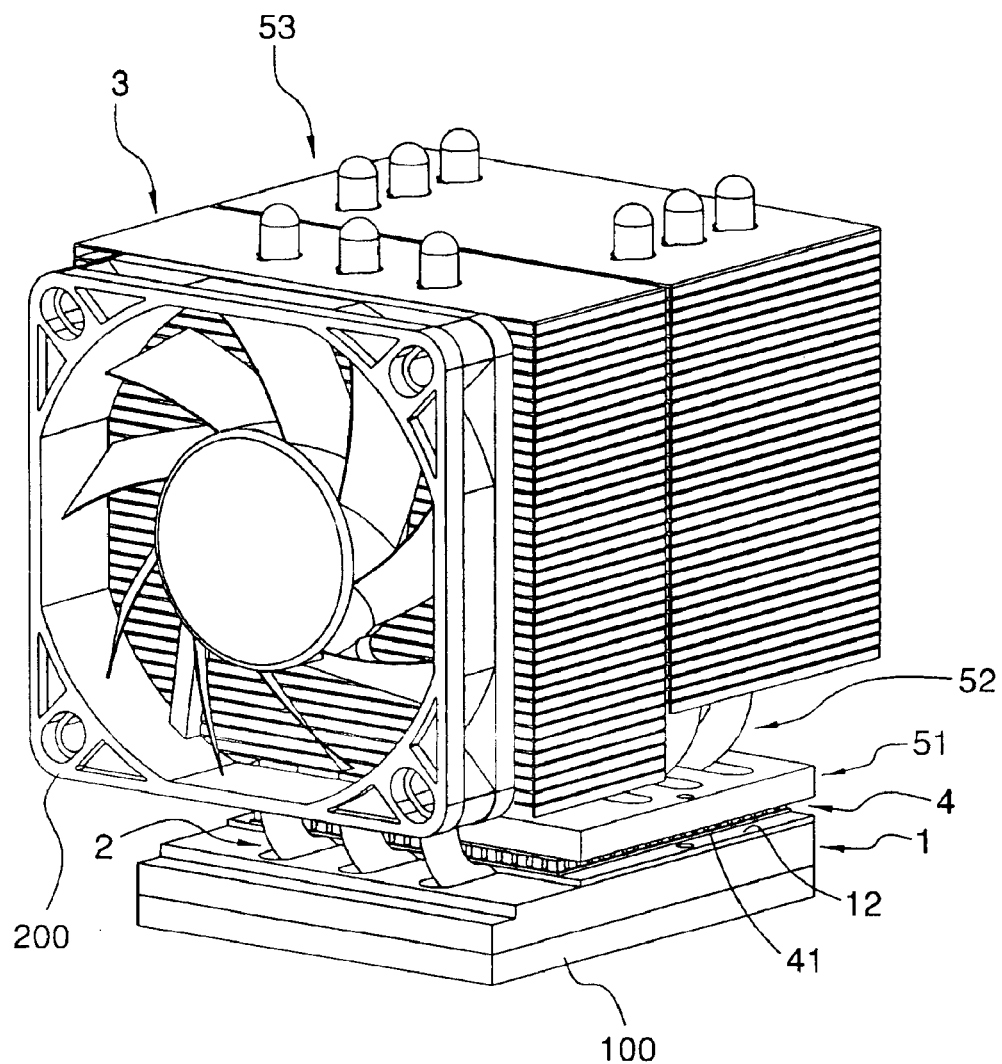
FIG. 2 is a perspective view of the first embodiment.
Figure 3:
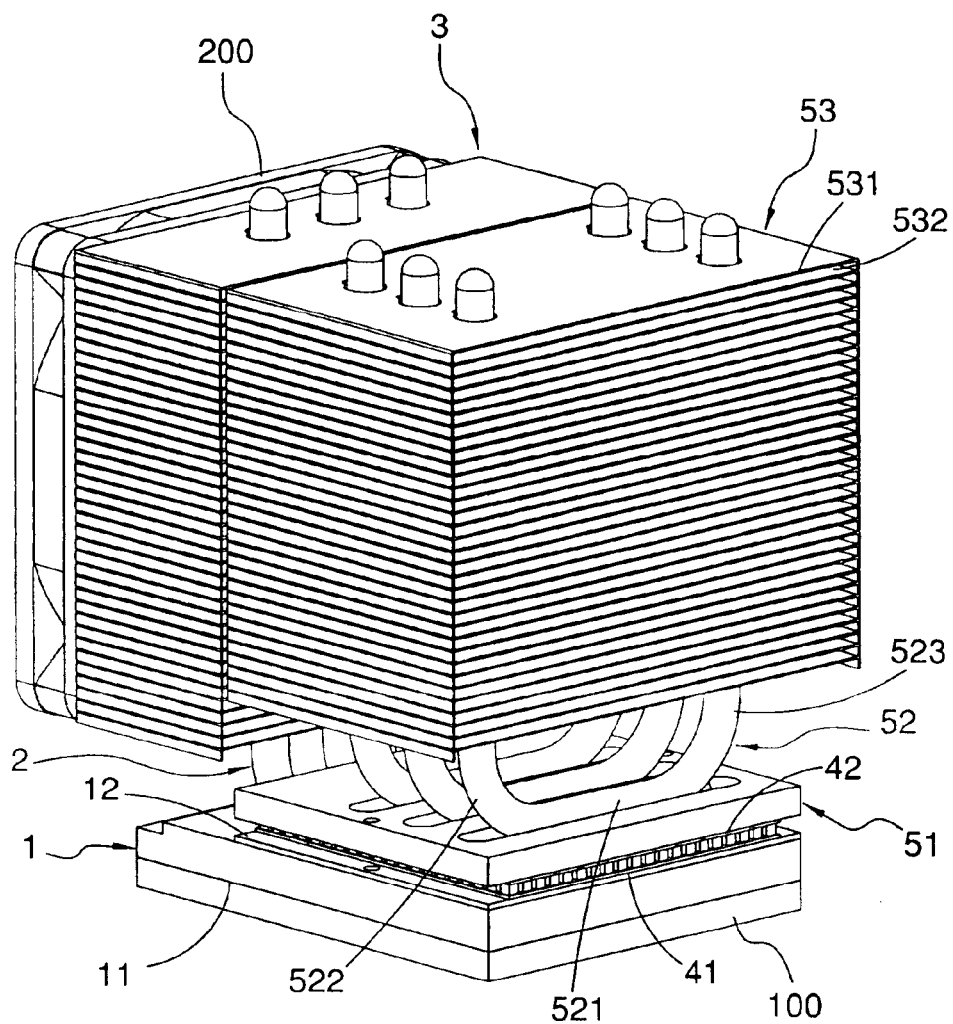
FIG. 3 is another perspective view of the first embodiment.

With reference to FIG. 1 to FIG. 3, the first embodiment of the present invention is for cooling a CPU 100. The thermoelectric cooling apparatus contains a front heat absorbing block 1, three front heat pipes 2 (front heat conductive device), a front radiator 3, a thermoelectric cooler 4, and a back radiating module 5. The front heat absorbing block 1 has a first surface 11 and a second surface 12. The first surface 11 is the opposite side of the second surface 12 and the first surface 11 contacts the CPU 100. Each of the front heat pipes 2 has a first portion 21 and a second portion 22. The first portion 21 is connected with the front heat absorbing block 1. The second portion 22 extends from an end of the first portion 21 to a remote end away from the front heat absorbing block 1. The three front heat pipes 2 are parallel to each other. The front radiator 3 is connected with the second portions 22 of the three front heat pipes 2. The thermoelectric cooler 4 has a cold side 41 and a hot side 42. The cold side 41 is the opposite side of the hot side 42. The cold side 41 contacts the second surface 12 of the front heat absorbing block 1 for transmitting heat collected from the front heat absorbing block 1 from the cold side 41 to the hot side 42. The back radiating module 5 contacts the hot side 42 of the thermoelectric cooler 4 for radiating heat collected therefrom.

The first embodiment further contains a temperature sensor 300 and a control circuit 400. The temperature sensor 300 directly contacts the CPU 100 and providing an indication thereof to the control circuit 400 wherein the control circuit 400 is coupled to the thermoelectric cooler 4 for varying amount of electricity in accordance with the indication.

The first portion 21 of the front heat pipe 2 is embedded in the front heat absorbing block 1 and the second portion 22 of the front heat pipe 2 is installed in the front radiator 3. The back radiating module 5 contains a back heat absorbing block 51, three back heat pipes 52 and a back radiator 53. The back heat absorbing block 51 contacts the hot side 42 of the thermoelectric cooler 4. Each of the back heat pipes 52 has a first portion 521, a second portion 522 and a third portion 523. The first portion 521 is connected with the back heat absorbing block 51 and the second portion 522 extends from an end of the first portion 521 to a remote end away from the back heat absorbing block 51. The third portion 523 extends from the other end of the first portion 521 thereof to a remote end away from the back heat absorbing block 51. The back radiator 53 is connected with the second portions 522 and the third portions 523 of the back heat pipes 52. The first portion 521 of the back heat pipes 52 is embedded in the back heat absorbing block 51. The second and the third portions 522, 523 of the back heat pipes 52 are installed in the back radiator 53.

The front radiator 3 contains plural parallel first cooling fins 31 having plural first channels 32 formed therebetween. The back radiator 53 contains plural parallel second cooling fins 531 having plural second channels 532 formed therebetween. The first channels 32 are aligned with the second channels 532. A fan 200 is attached to the front radiator 3 and blows the first channels 32 first, then the second channels 532, because the back radiator 53 dissipates more heat than the front radiator 3.

The front heat absorbing block 1 is fastened to the CPU 100 by clippers to provide a tight contact surface therebetween thereby the heat produced by the CPU 100 can be absorbed by the front heat absorbing block 1 efficiently. The heat produced by the CPU 100 is dissipated through two routes. The first route is through the front heat absorbing block 1, the front heat pipes 2, and the front radiator 3 in order. The second route is through the front heat absorbing block 1, the thermoelectric cooler 4, the back heat absorbing block 51, the back heat pipes 52 and the back radiator 53 in order. The front radiator 3 is located away from the front heat absorbing block 1 to dissipate a portion of the heat produced by the CPU 100. Thereby the temperature of the CPU 100 is reduced to a degree that the thermoelectric cooler 4 operates almost always under low wattage applications, under which the thermoelectric cooler 4 operates efficiently.

Figure 4:
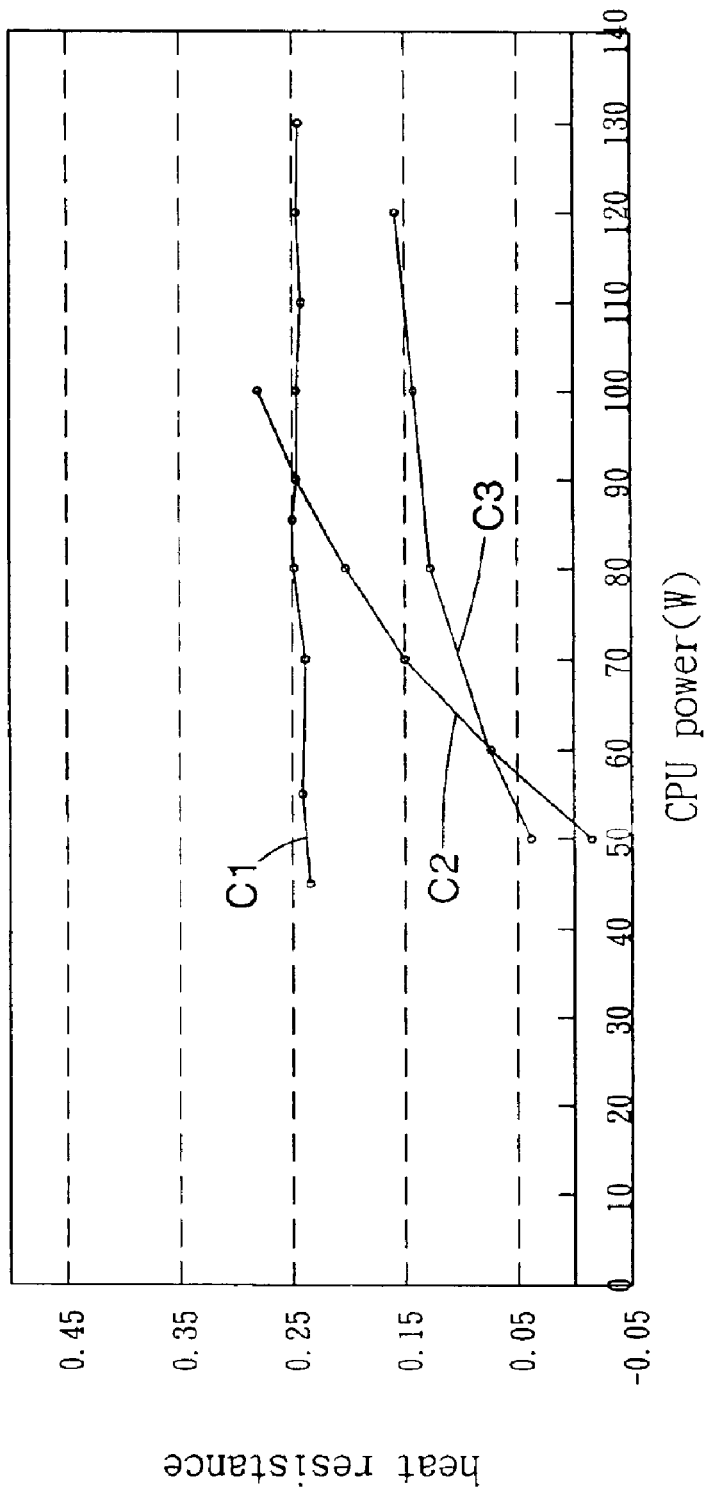
FIG. 4 illustrates test results of the first embodiment, a conventional TEC and a conventional non-TEC cooler.
Figure 5:
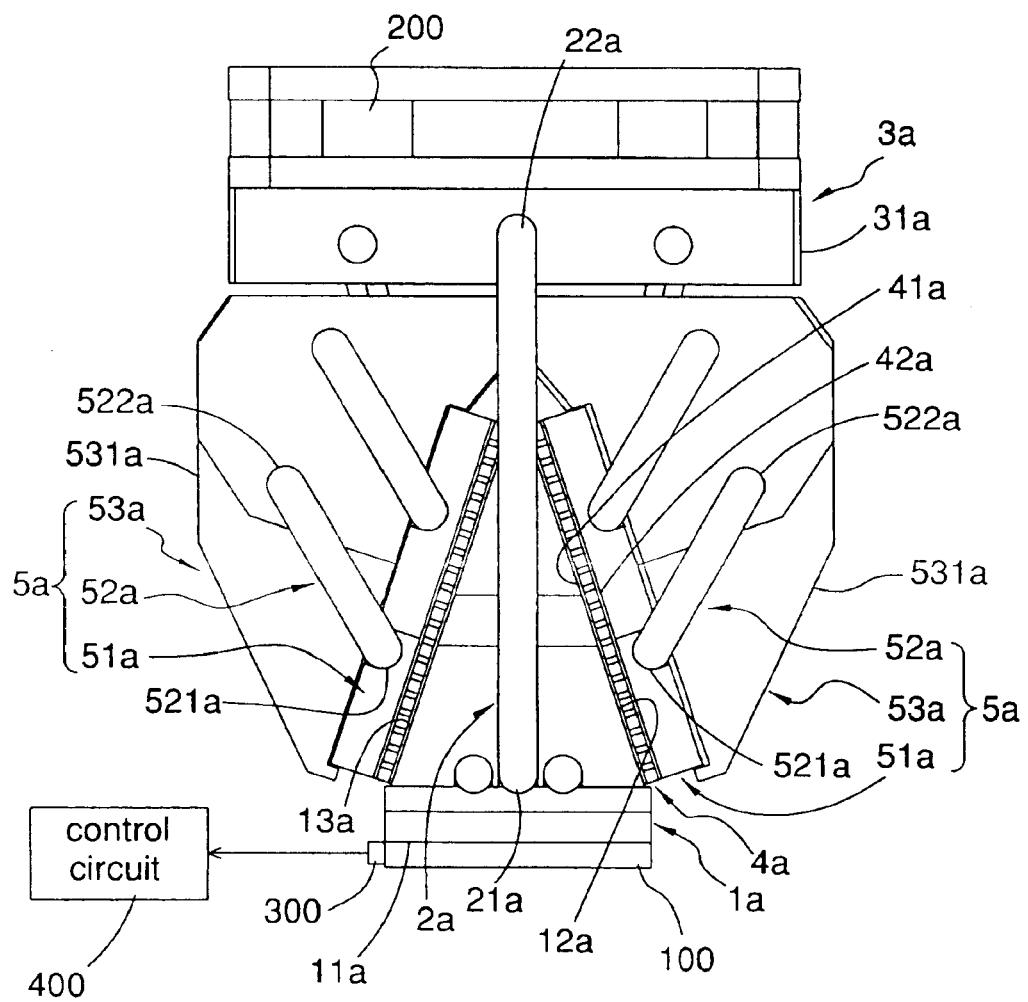
FIG. 5 is a side view of the second embodiment of present invention.
Figure 6:
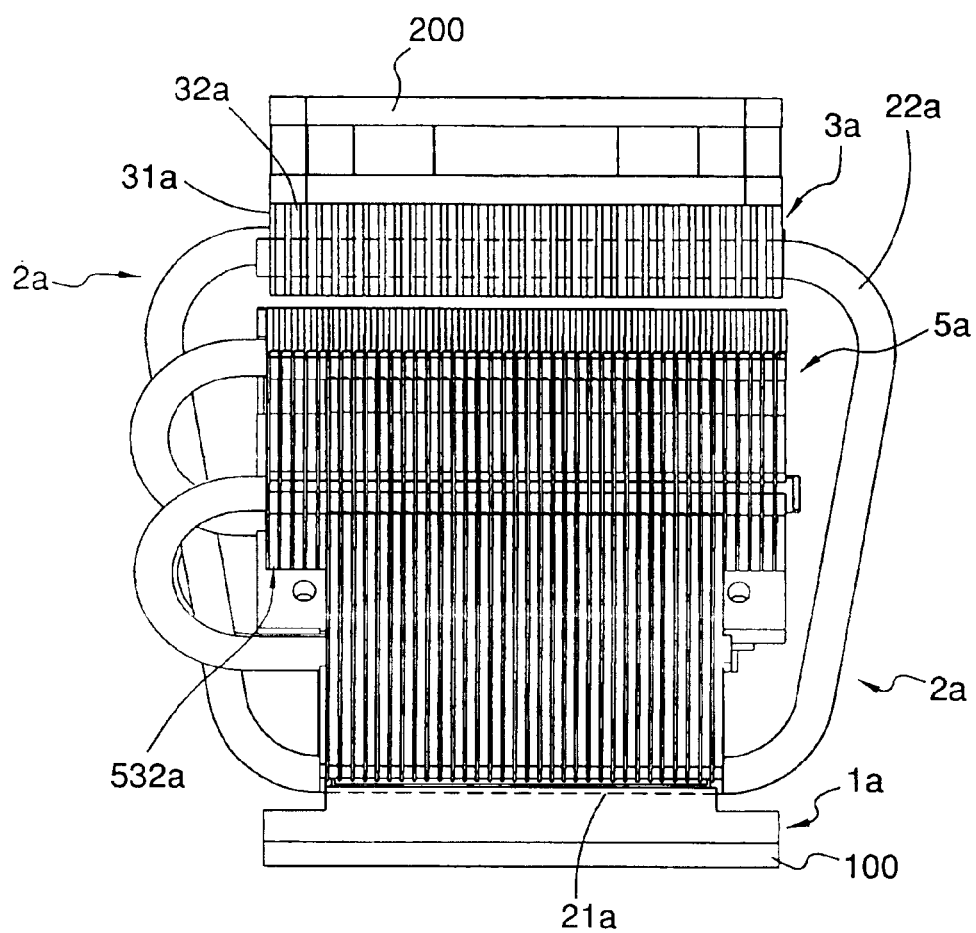
FIG. 6 is another side view of the second embodiment.
Figure 7:
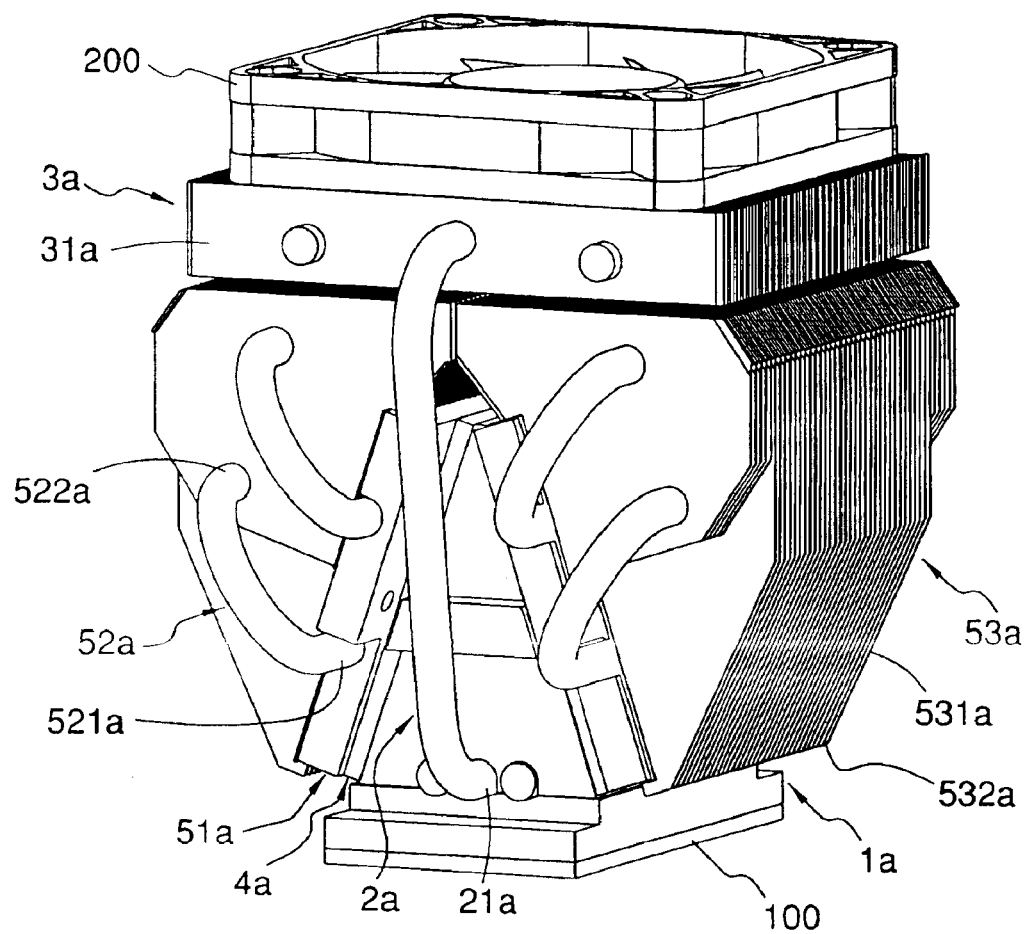
FIG. 7 is a perspective view of the second embodiment.
Figure 8:
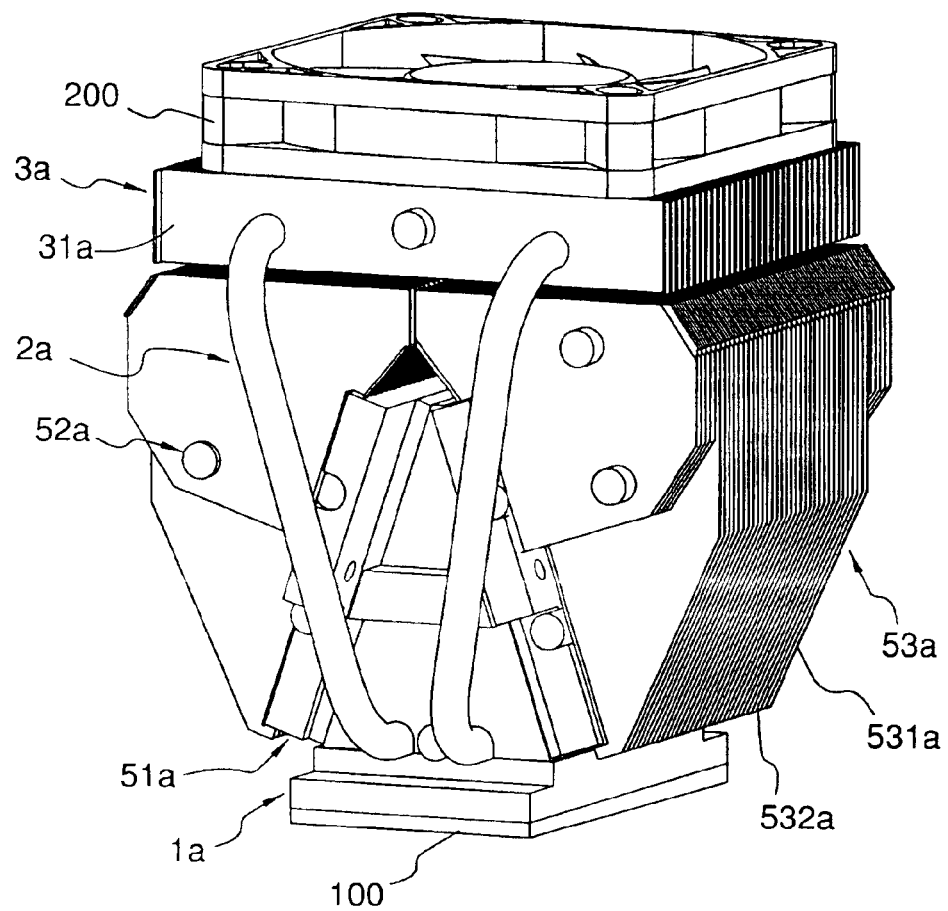
FIG. 8 is another perspective view of the second embodiment.

In accordance to FIG. 4, which contains test results of the first embodiment (curve C3), the conventional TEC (curve C2) and the conventional non-TEC cooler (curve C1), the first embodiment has better performance than the conventional TEC and the conventional non-TEC cooler under high wattage applications (more than 60 watts) and the heat resistance of the first embodiment is always under 0.25, which is the constant heat resistance of the conventional non-TEC cooler.

With reference to FIGS. 5–8, the second embodiment of the present invention for cooling the CPU 100 mainly contains: a front heat absorbing block 1a, three front heat pipes 2a (front heat conductive device), a front radiator 3a, two thermoelectric coolers 4a, and two back radiating modules 5a. The front heat absorbing block 1a has a bottom surface 11a and two side surfaces 12a, 13a. The bottom surface 11a contacts the CPU 100. Each of the front heat pipes 2a has a first portion 21a and a second portion 22a. The first portion 21a is connected with and embedded in the front heat absorbing block 1a. The second portion 22a extends from an end of the first portion 21a to a remote end away from the front heat absorbing block 1a and crooked into the front radiator 3a. One front heat pipe 2a has the second portion 22a extends from one direction and the other two front heat pipe 2a has the second portions 22a extends from the opposite direction. Each of the two thermoelectric coolers 4a has a cold side 41a and a hot side 42a and the cold side 41a is the opposite side of the hot side 42a. Each of the two thermoelectric coolers 4a contacts one of the two side surfaces 12a, 13a of the front heat absorbing block 1a with the cold side 41a for transmitting heat collected from the front heat absorbing block 1a from the cold side 41a to the hot side 42a. The two back radiating modules 5a contact the hot sides 42a of the two thermoelectric coolers 4a respectively for radiating heat collected therefrom.

The second embodiment further contains the temperature sensor 300 and the control circuit 400. The temperature sensor 300 directly contacts the CPU 100 and providing an indication thereof to the control circuit 400 wherein the control circuit 400 is coupled to the thermoelectric coolers 4a for varying amount of electricity in accordance with the indication.

Each of the two back radiating modules 5a contains a back heat absorbing block 51a, two back heat pipes 52a and a back radiator 53a. The back heat absorbing block 51a, contacts a hot side 42a of one of the two thermoelectric coolers 4a. Each of the two back heat pipes 52a, has a first portion 521a, and a second portion 522a. The first portion 521a is connected with and embedded in the back heat absorbing block 51a. The second portion 522a extends from an end of the first portion 521a to a remote end away from the back heat absorbing block 51a and crooked into and is connected with the back radiator 53a.

The front radiator 3a contains plural parallel first cooling fins 31a having plural first channels 32a formed therebetween. The two back radiators 53a contain plural parallel second cooling fins 531a having plural second channels 532a formed therebetween. The first channels 32a are aligned with the second channels 532a.

The front radiator 3a is placed above of the two back radiators 53a and a fan 200 is placed above the front radiator 3a. Thereby the fan 200 blows the front radiator 3a first, then the back radiator 53a. This preferred arrangement is based on that the back radiator 53a dissipates more heat than the front radiator 3a.

Figure 9:
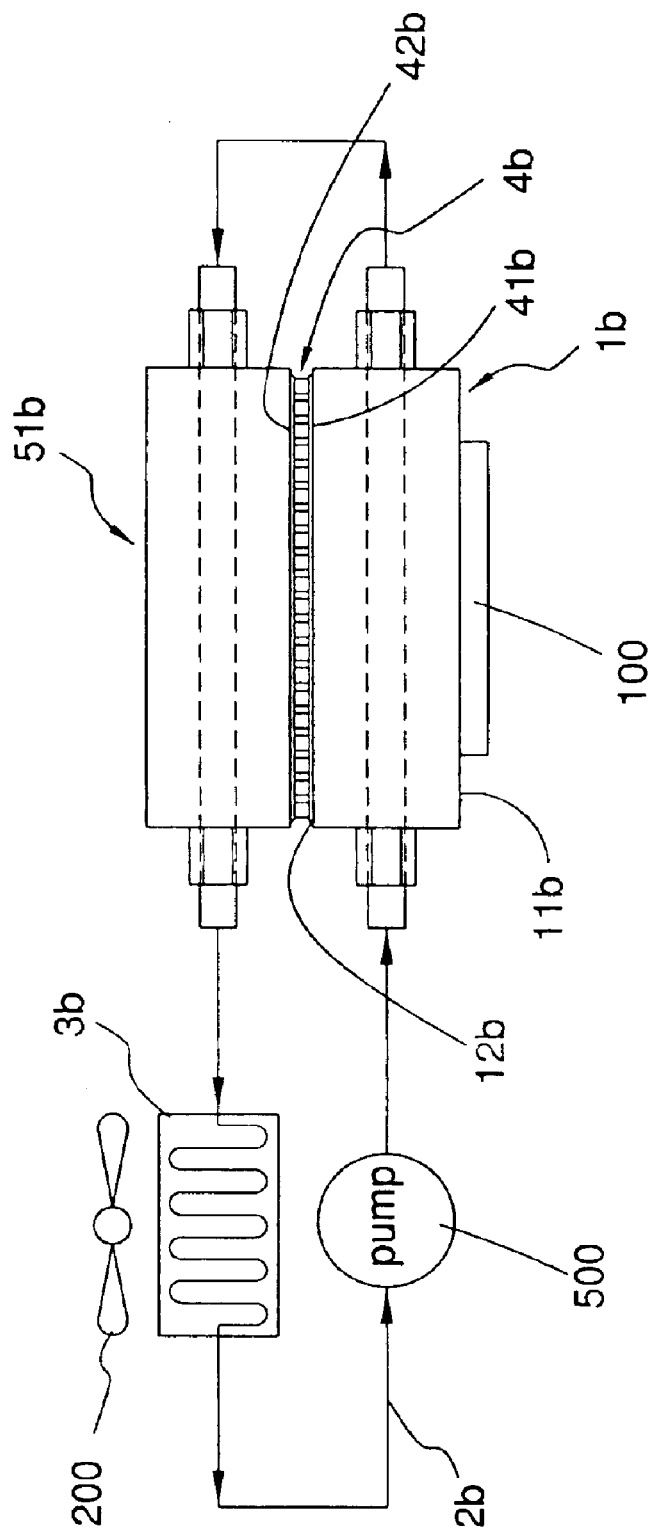
FIG. 9 is a planar view of the third embodiment.

With reference to FIG. 9, the third embodiment contains a front heat absorbing block 1b, a water-cooling loop 2b, a front radiator 3b, a thermoelectric cooler 4b, a back radiating module (a back heat absorbing block 51b) and a pump 500. The front heat absorbing block 1b has a first surface 11b and a second surface 12b. The first surface 11b is the opposite side of the second surface 12b and contacts the CPU 100. The thermoelectric cooler 4b has a cold side 41b and a hot side 42b. The cold side 41b is the opposite side of the hot side 42b. The cold side 41b contacts the second surface 12b of the front heat absorbing block 1b for transmitting heat collected from the front heat absorbing block 1b from the cold side 41b to the hot side 42b. The back heat absorbing block 51b contacts the hot side 42b of the thermoelectric cooler 4b. In addition, the water-cooling loop 2b is arranged for systematically linking up the front heat absorbing block 1b, the back heat absorbing block 51b, the front radiator 3b and the pump 500 by utilizing heat pipes. The water-cooling loop 2b contains cooling water within for water circulation by the pump 500.

The water-cooling loop 2b dissipates the heat in the front heat absorbing block 1b and the back heat absorbing block 51b through repeating the following steps: 1. The pump 500 pumps cold cooling water to the front heat absorbing block 1b; 2. The cold cooling water runs through the front heat absorbing block 1b via the heat pipes and also takes away the heat collected by the front heat absorbing block 1b; therefore, the cold cooling water becomes warm cooling water; 3. The warm cooling water then runs through the back heat absorbing block 51b via the heat pipes and also takes away the heat collected by the back heat absorbing block 51b; therefor the warm cooling water becomes hot cooling water; and 4. The hot cooling water is cooled to becoming cold cooling water by the front radiator 3b and the cooled cold cooling water is then delivered to the pump 500. Furthermore, the front radiator 3b associated with the fan 200 helps with the cooling processes.

Figure 10:
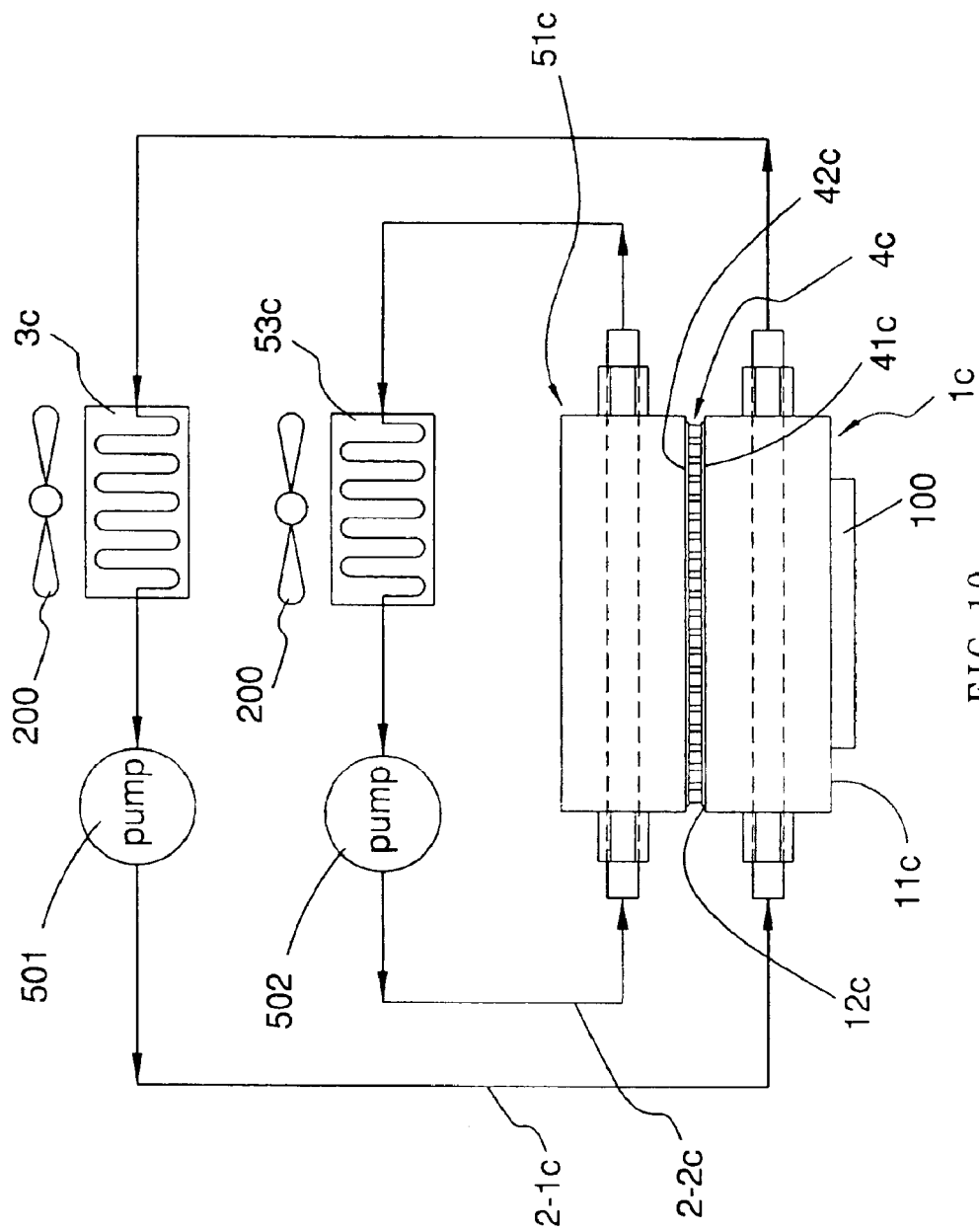
FIG. 10 is a planar view of the fourth embodiment.

With reference to FIG. 10, the fourth embodiment contains a front heat absorbing block 1c, a first water-cooling loop 2-1c, a second water-cooling loop 2-2c, a front radiator 3c, a back radiator 53c, a thermoelectric cooler 4c, a back heat absorbing block 51c, a first pump 501 and a second pump 502. The front heat absorbing block 1c has a first surface 11c and a second surface 12c. The first surface 11c is the opposite side of the second surface 12c and the first surface 11c contacts the CPU 100. The thermoelectric cooler 4c has a cold side 41c and a hot side 42c. The cold side 41c is the opposite side of the hot side 42c. The cold side 41c contacts the second surface 12c of the front heat absorbing block 1c for transmitting heat collected from the front heat absorbing block 1c from the cold side 41c to the hot side 42c. The back heat absorbing block 51c contacts the hot side 42c of the thermoelectric cooler 4c. Similarly to the third embodiment, the first water-cooling loop 2-1c is arranged for systematically linking up the front heat absorbing block 1c, the front radiator 3c and the first pump 501 by utilizing heat pipes. In addition, the second water-cooling loop 2-2c is arranged for systematically linking up the back heat absorbing block 51c, the back radiator 53c and the second pump 502 by utilizing heat pipes. Furthermore, both The first water-cooling loop 2-1c and the second water-cooling loop 2-2c contain cooling water within respectively for water circulation by the first pump 501 and the second pump 502.

The first water-cooling loop 2-1c dissipates the heat in the front heat absorbing block 1c through repeating the following steps: 1. The first pump 501 pumps cold cooling water to the front heat absorbing block 1c; 2. The cold cooling water runs through the front heat absorbing block 1c via the heat pipes and also takes away the heat collected by the front heat absorbing block 1c; therefore, the cold cooling water becomes warm cooling water; and 3. The warm cooling water is cooled to becoming cold cooling water by the front radiator 3c and the cooled cold cooling water is then delivered to the first pump 501. Similarly, the second water-cooling loop 2-2c dissipates the heat in the back heat absorbing block 51c through repeating the following steps: 1. The second pump 502 pumps cold cooling water to the back heat absorbing block 51c; 2. The cold cooling water runs through the back heat absorbing block 51c via the heat pipes and also takes away the heat collected by the back heat absorbing block 51c; therefore, the cold cooling water becomes warm cooling water; and 3. The warm cooling water is cooled to becoming cold cooling water by the back radiator 53c and the cooled cold cooling water is then delivered to the second pump 502. Furthermore, the front radiator 3b and the back radiator 53c associated with the fans 200 help with the cooling processes.

The front heat absorbing block 1 and the back heat absorbing block 51 in the first embodiment, and the front heat absorbing block 1a and the back heat absorbing block 51a in the second embodiment are made of copper or aluminum. The first cooling fins 31, 31a and the second cooling fins 531, 531a are made of extruded aluminum or by punching aluminum or copper plates. The thermoelectric coolers 4, 4a in the first and the second embodiments are Marlow DT12-6 or Melcor CP 1.4-127-06L.

Numerous characteristics and advantages of the invention have been set forth in the foregoing description, together with details of the structure and function of the invention, and the novel features thereof are pointed out in appended claims. The disclosure, however, is illustrated only, and changes may be made in detail, especially, in matters of shape, size and arrangement of parts, materials and the combination thereof within the principle of the invention, to the full extent indicated by the broad general meaning of the terms in which the appended claims are expressed.

We claim:

1. A thermoelectric cooling apparatus for cooling an electronic device comprising:

a front heat absorbing block having a first surface and a second surface, said first surface being the opposite side of said second surface, said first surface contacting said electronic device;

a front heat conductive device having a first portion and a second portion, said first portion being connected with said front heat absorbing block, said second portion extending from an end of said first portion to a remote end away from said front heat absorbing block;

a front radiator connected with said second portion of said front heat conductive device;

a thermoelectric cooler having a cold side and a hot side, said cold side being the opposite side of said hot side, said cold side contacting said second surface of said front heat absorbing block for transmitting heat collected from said front heat absorbing block from said cold side to said hot side; and a back radiating module contacting said hot side of said thermoelectric cooler for radiating heat collected therefrom.

2. The apparatus of claim 1 further comprising a fan for blowing said front radiator.

3. The apparatus of claim 1, wherein said front heat conductive device comprises at least a heat pipe.

4. The apparatus of claim 1, wherein said front heat conductive device comprises a water-cooling loop for systematically linking up said front heat absorbing block, said back radiating module, said front radiator and a pump, said water-cooling loop having cooling water within for water circulation by said pump.

5. The apparatus of claim 1, wherein said front heat conductive device comprises a water-cooling loop for systematically linking up said front heat absorbing block, said front radiator and a pump, said water-cooling loop having cooling water within for water circulation by said pump.

6. The apparatus of claim 1 further comprising a temperature sensor and a control circuit, said temperature sensor directly contacting said electronic device and providing an indication thereof to said control circuit wherein the said control circuit is coupled to said thermoelectric cooler for varying amount of electricity in accordance with said indication.

7. The apparatus of claim 1 wherein said first portion of said front heat conductive device is embedded in said front heat absorbing block and said second portion of said front heat conductive device is installed in said front radiator.

8. The apparatus of claim 1 wherein said back radiating module comprises:

a back heat absorbing block, contacting said hot side of said thermoelectric cooler;

at least a back heat pipe, having a first portion and a second portion, said first portion being connected with said back heat absorbing block, said second portion extending from an end of said first portion to a remote end away from said back heat absorbing block; and a back radiator, connected with said second portion of said at least a back heat pipe.

9. The apparatus of claim 8, wherein said at least a back heat pipe further comprises a third portion extending from the other end of said first portion thereof to a remote end away from said back heat absorbing block, said first portion of said at least a back heat pipe being embedded in said back heat absorbing block, said second and said third portions of said at least a back heat pipe being installed in said back radiator.

10. The apparatus of claim 8 further comprising a fan, wherein said front radiator comprises plural parallel first cooling fins having plural first channels formed therebetween, said back radiator having plural parallel second cooling fins having plural second channels formed therebetween, said first channels being aligned with said second channels, said fan blowing said first channels first, then said second channels.

11. A thermoelectric cooling apparatus for cooling an electronic device comprising:

a front heat absorbing block comprising a bottom surface and two side surfaces, said bottom surface contacting said electronic device;

a front heat conductive device having a first portion and a second portion, said first portion being connected with said front heat absorbing block, said second portion extending from an end of said first portion to a remote end away from said front heat absorbing block;

a front radiator, connected with said second portion of said front heat conductive device;

two thermoelectric coolers, each of said two thermoelectric coolers having a cold side and a hot side, said cold side being the opposite side of said hot side, each of said two thermoelectric coolers contacting one of said two side surfaces of said front heat absorbing block with said cold side for transmitting heat collected from said front heat absorbing block from said cold side to said hot side; and two back radiating modules contacting said hot sides of said two thermoelectric coolers respectively for radiating heat collected therefrom.

12. The apparatus of claim 11, wherein said front heat conductive device comprises at least a heat pipe.

13. The apparatus of claim 11, wherein said front heat conductive device comprises a water-cooling loop for systematically linking up said front heat absorbing block, said two back radiating modules, said front radiator and a pump, said water-cooling loop having cooling water within for water circulation by said pump.

14. The apparatus of claim 11, wherein said front heat conductive device comprises a water-cooling loop for systematically linking up said front heat absorbing block, said front radiator and a pump, said water-cooling loop having cooling water within for water circulation by said pump.

15. The apparatus of claim 11 further comprising a fan for blowing said front radiator.

16. The apparatus of claim 1 further comprising a temperature sensor and a control circuit, said temperature sensor directly contacting said electronic device and providing an indication thereof to the control circuit wherein said control circuit is coupled to said two thermoelectric coolers for varying amount of electricity in accordance with said indication.

17. The apparatus of claim 11 wherein said first portion of said front heat conductive device is embedded in said front heat absorbing block and said second portion of said front heat conductive device is installed in said front radiator.

18. The apparatus of claim 11, wherein each of said two back radiating modules comprises:

a back heat absorbing block, contacting a hot side of one of said two thermoelectric coolers;

at least a back heat pipe, having a first portion and a second portion, said first portion being connected with said back heat absorbing block, said second portion extending from an end of said first portion to a remote end away from said back heat absorbing block; and a back radiator, connected with said second portion of said at least a back heat pipe.

19. The apparatus of claim 18, wherein said second portion of said at least a back heat pipe is crooked into said back radiator, said first portion of said at lease a back heat pipe being embedded in said back heat absorbing block.

20. The apparatus of claim 18 further comprising a fan wherein said front radiator comprises plural parallel first cooling fins having plural first channels formed therebetween, said two back radiators having plural parallel second cooling fins having plural second channels formed therebetween said first channels being aligned with said second channels, said fan blowing said first channels first, then said second channels.

* * * * *